(12) United States Patent
Weng et al.

(10) Patent No.: US 12,349,448 B2
(45) Date of Patent: Jul. 1, 2025

(54) INTEGRATION MANUFACTURING METHOD OF DEPLETION HIGH VOLTAGE NMOS DEVICE AND DEPLETION LOW VOLTAGE NMOS DEVICE

(71) Applicant: Richtek Technology Corporation, Zhubei (TW)

(72) Inventors: Wu-Te Weng, Hsinchu (TW); Chih-Wen Hsiung, Hsinchu (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 479 days.

(21) Appl. No.: 17/981,387

(22) Filed: Nov. 5, 2022

(65) Prior Publication Data
US 2023/0178438 A1    Jun. 8, 2023

Related U.S. Application Data

(60) Provisional application No. 63/264,936, filed on Dec. 3, 2021.

(30) Foreign Application Priority Data

Jun. 7, 2022    (TW) .................................. 111121084

(51) Int. Cl.
*H01L 21/02*    (2006.01)
*H10D 84/00*    (2025.01)
(Continued)

(52) U.S. Cl.
CPC ....... *H10D 84/038* (2025.01); *H10D 84/0128* (2025.01); *H10D 84/013* (2025.01);
(Continued)

(58) Field of Classification Search
CPC ............ H10D 84/038; H10D 84/0128; H10D 84/013; H10D 84/0135; H10D 84/0144;
(Continued)

(56) References Cited

U.S. PATENT DOCUMENTS 5,747,850 A    5/1998 Mei
6,806,133 B2 *    10/2004 Oh ...................... H10D 84/038
438/223

(Continued)

*Primary Examiner* — Sheikh Maruf
(74) *Attorney, Agent, or Firm* — Tung & Associates

(57) ABSTRACT

An integration manufacturing method of a depletion high voltage NMOS device and a depletion low voltage NMOS device includes: providing a substrate; forming a semiconductor layer on the substrate; forming insulation regions on the semiconductor layer; forming an N-type well in the depletion high voltage NMOS device region; forming a high voltage P-type well in the semiconductor layer, wherein the N-type well and the high voltage P-type well are in contact with each other in a channel direction; forming an oxide layer on the semiconductor layer after the N-type well and the high voltage P-type well formed; forming a low voltage P-type well; and forming an N-type high voltage channel region and an N-type low voltage channel region, such that each of the depletion high voltage NMOS device and the depletion low voltage NMOS device is turned ON when a gate-source voltage thereof is zero voltage.

12 Claims, 11 Drawing Sheets

(51) Int. Cl.
 *H10D 84/01* (2025.01)
 *H10D 84/03* (2025.01)
(52) U.S. Cl.
 CPC ..... *H10D 84/0135* (2025.01); *H10D 84/0144* (2025.01); *H10D 84/0151* (2025.01)
(58) Field of Classification Search
 CPC ............ H10D 84/0151; H10D 30/603; H10D 64/516; H10D 84/0156
 USPC .......................................................... 438/294
 See application file for complete search history.

(56) References Cited

U.S. PATENT DOCUMENTS

| | | | | |
|---|---|---|---|---|
| 7,781,843 B1 * | 8/2010 | Weaver | ................ | H10D 84/038 438/142 |
| 2003/0216016 A1 * | 11/2003 | Oh | ....................... | H10D 84/038 257/E21.644 |
| 2006/0006462 A1 * | 1/2006 | Chang | ................... | H10D 62/116 257/E21.549 |
| 2006/0017114 A1 * | 1/2006 | Chen | ................... | H10D 84/0181 257/E21.639 |
| 2006/0141714 A1 | 6/2006 | Lee | | |
| 2007/0132033 A1 * | 6/2007 | Wu | ........................ | H10D 30/65 257/500 |
| 2007/0164310 A1 * | 7/2007 | Kwon | ................... | H10D 89/611 257/173 |
| 2007/0164392 A1 * | 7/2007 | Jeong | ................... | H10D 30/027 257/E29.255 |
| 2009/0286366 A1 * | 11/2009 | Helm | ................... | H10D 84/0167 257/E21.632 |
| 2011/0006372 A1 * | 1/2011 | Helm | ................... | H10D 84/0191 257/369 |
| 2013/0045577 A1 * | 2/2013 | Huang | ............... | H10D 84/0181 257/E21.632 |
| 2014/0011304 A1 * | 1/2014 | Fan | ......................... | H01L 22/12 438/14 |
| 2020/0266188 A1 * | 8/2020 | Wang | ................... | H10D 89/711 |

* cited by examiner

INTEGRATION MANUFACTURING METHOD OF DEPLETION HIGH VOLTAGE NMOS DEVICE AND DEPLETION LOW VOLTAGE NMOS DEVICE

CROSS REFERENCE

The present invention claims priority to U.S. Ser. No. 63/264,936 filed on Dec. 3, 2021 and claims priority to TW 111121084 filed on Jun. 7, 2022.

BACKGROUND OF THE INVENTION

Field of Invention

The present invention relates to an integration manufacturing method of a depletion high voltage NMOS device and a depletion low voltage NMOS device; particularly, it relates to such integration manufacturing method wherein the depletion high voltage NMOS device and the depletion low voltage NMOS device are turned ON when a gate-source voltage thereof is zero voltage.

Description of Related Art

In a conventional manufacturing method for a depletion low voltage device, prior to the formation of a low voltage well, a sacrifice oxide layer is formed, to serve as a block layer for ion implantation during an ion implantation process for forming the low voltage well, thereby preventing a semiconductor layer from being directly bombarded, so that no defect will occur in the semiconductor layer.

The sacrifice oxide layer is formed by a thermal oxide formation process wherein a thermal budget is in concern. It is vital for an integration process of a semiconductor device to control its thermal budget. As the size of a semiconductor device decreases, it becomes even more important to control the thermal budget.

In view of the above, the present invention proposes an integration manufacturing method of a depletion high voltage NMOS device and a depletion low voltage NMOS device, which consumes a lower thermal budget so that the contour of impurities doped in the semiconductor device can be precisely controlled.

SUMMARY OF THE INVENTION

From one perspective, the present invention provides an integration manufacturing method of a depletion high voltage NMOS device and a depletion low voltage NMOS device, comprising: providing a substrate; forming a semiconductor layer on the substrate; forming a plurality of insulation regions on the semiconductor layer, for defining a depletion high voltage NMOS device region and a depletion low voltage NMOS device region; forming an N-type well in the semiconductor layer in the depletion high voltage NMOS device region, wherein a part of the N-type well defines a drift region to serve as a drift current channel in an ON operation of the depletion high voltage NMOS device; forming a high voltage P-type well in the semiconductor layer in the depletion high voltage NMOS device region, wherein the N-type well and the high voltage P-type well are in contact with each other in a channel direction; subsequent to the formation of the N-type well and the high voltage P-type well, forming an oxide layer on the semiconductor layer, wherein the oxide layer overlays the depletion high voltage NMOS device region and the depletion low voltage NMOS device region; subsequent to the formation of the oxide layer, forming a low voltage P-type well in the semiconductor layer in the depletion low voltage NMOS device region; wherein the low voltage P-type well is formed by implanting impurities which pass through the oxide layer in a defined region in the form of accelerated ions via an ion implantation process step; and forming an N-type high voltage channel region in the depletion high voltage NMOS device region and forming an N-type low voltage channel region in the depletion low voltage NMOS device region via a same ion implantation process, such that each of the depletion high voltage NMOS device and the depletion low voltage NMOS device is turned ON when a gate-source voltage thereof is zero voltage.

In one embodiment, the integration manufacturing method of a depletion high voltage NMOS device and a depletion low voltage NMOS device further comprises: forming a high voltage N-type buried layer on the substrate and in the depletion high voltage NMOS device region via an ion implantation process step; forming a first N-type isolation region in the semiconductor layer by a same ion implantation process that forms the N-type well, wherein the first N-type isolation region is connected to the high voltage N-type buried layer in a vertical direction, and wherein in the channel direction, the first N-type isolation region is in contact with a side of the high voltage P-type well, wherein this side of the high voltage P-type well is opposite to another side of the high voltage P-type well which is in contact with the N-type well; forming a first P-type isolation region between the depletion high voltage NMOS device region and the depletion low voltage NMOS device region by a same ion implantation process that forms the high voltage P-type well; and forming a second P-type isolation region between the depletion high voltage NMOS device region and the depletion low voltage NMOS device region by the same ion implantation process that forms the low voltage P-type well; wherein the first P-type isolation region is connected to the second P-type isolation region in the vertical direction; wherein the high voltage N-type buried layer, the first N-type isolation region, the first P-type isolation region and the second P-type isolation region constitute a high voltage isolation region, which serves to electrically isolate the depletion high voltage NMOS device region from the depletion low voltage NMOS device region in the semiconductor layer.

In one embodiment, the integration manufacturing method of a depletion high voltage NMOS device and a depletion low voltage NMOS device further comprises: subsequent to the formation of the low voltage P-type well, etching the oxide layer by a lithography process and an etching process, to form a reduced surface field (RESURF) oxidation region in the depletion high voltage NMOS device region; subsequent to the formation of the RESURF oxidation region, forming a gate oxide layer on the semiconductor layer, wherein the gate oxide layer is in contact with the semiconductor layer, wherein the gate oxide layer overlays the depletion high voltage NMOS device region and the depletion low voltage NMOS device region; forming a polysilicon layer on the gate oxide layer, wherein the polysilicon layer is in contact with the gate oxide layer; and etching the polysilicon layer by a lithography process and an etching process, to form a high voltage gate in the depletion high voltage NMOS device region and a low voltage gate in the depletion low voltage NMOS device region.

In one embodiment, the integration manufacturing method of a depletion high voltage NMOS device and a depletion low voltage NMOS device further comprises:

forming a low voltage N-type buried layer on the substrate and in the depletion low voltage NMOS device region by the same ion implantation process step that forms the high voltage N-type buried layer; and forming a second N-type isolation region and a third N-type isolation region in the semiconductor layer by the same ion implantation process step that forms the N-type well, wherein the second N-type isolation region and the third N-type isolation region are both connected to the low voltage N-type buried layer in the vertical direction, wherein in the channel direction, the second N-type isolation region is in contact with one side of the low voltage P-type well, whereas, the third N-type isolation region is in contact with another side of the low voltage P-type well; wherein the low voltage N-type buried layer, the second N-type isolation region and the third N-type isolation region constitute a low voltage isolation region, which serves to electrically isolate the depletion low voltage NMOS device region from the depletion high voltage NMOS device region in the semiconductor layer.

In one embodiment, the integration manufacturing method of a depletion high voltage NMOS device and a depletion low voltage NMOS device further comprises: forming a high voltage source and a high voltage drain in the semiconductor layer, wherein the high voltage source and the high voltage drain are located below and outside two sides of the high voltage gate, respectively, wherein the side of the high voltage gate which is closer to the high voltage source is a source side and the side of the high voltage gate which is closer to the high voltage drain is a drain side, and wherein the high voltage source is located in the high voltage P-type well, and the high voltage drain is located in the N-type well outside the drain side; and wherein in the channel direction, the drift region is located in the N-type well and is located between the high voltage drain and the high voltage P-type well, wherein each of the high voltage source and the high voltage drain has a N-type conductivity type.

In one embodiment, the integration manufacturing method of a depletion high voltage NMOS device and a depletion low voltage NMOS device further comprises: forming a low voltage source and a low voltage drain in depletion low voltage NMOS device region in the semiconductor layer by the same ion implantation process that forms the high voltage source and the high voltage drain, wherein the low voltage source and the low voltage drain are located below and outside two sides of the low voltage gate respectively, wherein the side of the low voltage gate which is closer to the low voltage source is a source side and the side of the low voltage gate which is closer to the low voltage drain is a drain side, and wherein the low voltage source is located in the low voltage P-type well, and the low voltage drain is located in the low voltage P-type well outside the drain side.

In one embodiment, the integration manufacturing method of a depletion high voltage NMOS device and a depletion low voltage NMOS device further comprises: forming a high voltage P-type contact region in the high voltage P-type well and forming a low voltage P-type contact region in the low voltage P-type well by a same ion implantation process, wherein the high voltage P-type contact region serves as an electrical contact of the high voltage P-type well, whereas, the low voltage P-type contact region serves as an electrical contact of the low voltage P-type well.

In one embodiment, the semiconductor layer is a P-type semiconductor epitaxial layer having a volume resistance which is 45 Ohm-cm.

In one embodiment, the RESURF oxidation region has a thickness ranging between 400 Å and 450 Å.

In one embodiment, the gate oxide layer has a thickness ranging between 80 Å and 100 Å.

In one embodiment, a gate driving voltage of the depletion high voltage NMOS device of the depletion high voltage NMOS device region is 3.3V.

In one embodiment, the low voltage gate has a minimum length which is 0.18 micrometer, and wherein the depletion low voltage NMOS device has a minimum feature size which is 0.18 micrometer.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Please refer to FIG. 1A to FIG. 1H, which show a first embodiment of the present invention. FIG. 1A to FIG. 1H show cross-section views of an integration manufacturing method of a depletion high voltage NMOS device and a depletion low voltage NMOS device of the present invention.

Figure 1A:
FIG. 1A to FIG. 1H show a first embodiment of the present invention.

As shown in FIG. 1A, a substrate 11 is provided. The substrate 11 is, for example but not limited to, a P-type or N-type semiconductor substrate. A depletion high voltage NMOS device and a depletion low voltage NMOS device can be formed on the substrate 11.

Figure 1B:
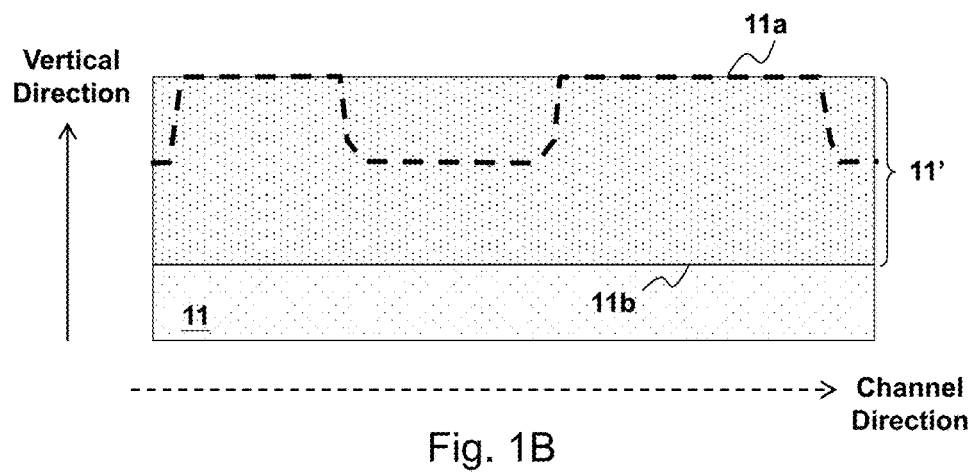

Next, referring to FIG. 1B, a semiconductor layer 11' is formed on the substrate 11. The semiconductor layer 11' has a top surface 11a and a bottom surface 11b opposite to the top surface 11a in a vertical direction (as indicated by the direction of the solid arrow in FIG. 1B, and all occurrences of the term "vertical direction" in this specification refer to the same direction). At this stage, the insulation regions 12 have not yet been formed on the semiconductor layer 11', so the top surface 11a has not yet been entirely defined. Subsequent to the formation of the insulation regions 12 on the semiconductor layer 11', the top surface 11a will be as shown by a thick fold-line in FIG. 1B. The semiconductor layer 11', for example, is formed on the substrate 11 by an epitaxial process, or is a part of the substrate 11. The semiconductor layer 11' can be formed by various methods known to a person having ordinary skill in the art, so the details thereof are not redundantly explained here.

In one embodiment, the semiconductor layer 11' is a P-type semiconductor epitaxial layer having a volume resistance which is 45 Ohm-cm.

Figure 1C:
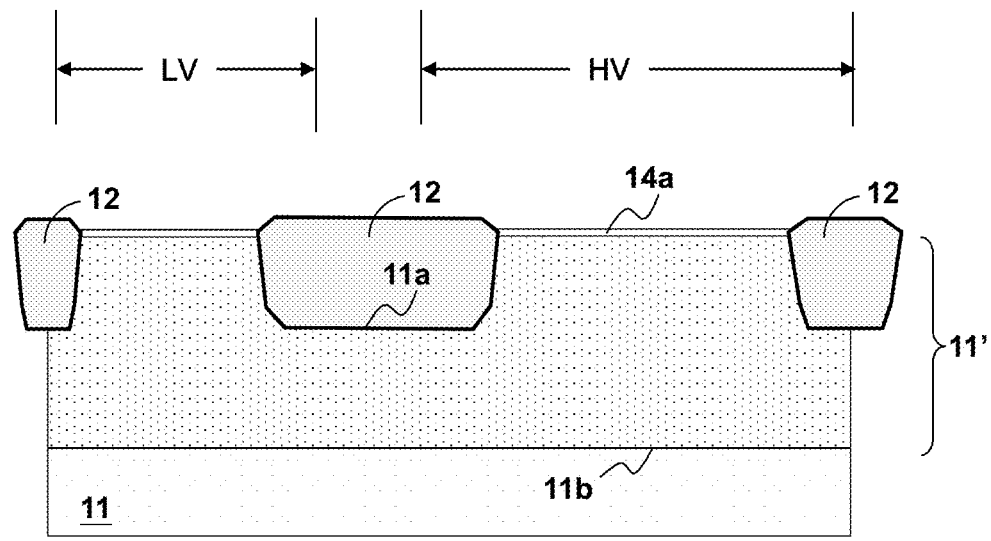

Next, referring to FIG. 1C, insulation regions 12 are formed on the semiconductor layer 11', for defining a depletion high voltage NMOS device HV and a depletion low voltage NMOS device LV. The insulation regions 12 can be, for example but not limited to, a shallow trench isolation (STI) structure or a local oxidation of silicon (LOCOS) structure. Referring still to FIG. 1C, subsequent to the formation of the insulation regions 12, a sacrifice oxide layer 14a is formed on the top surface 11a of the semiconductor layer 11', wherein the sacrifice oxide layer 14a serves as a block layer during an ion implantation process for forming an N-type well 14 and a high voltage P-type well 15, thereby preventing the semiconductor layer 11' from being directly bombarded to generate defects.

Figure 1D:
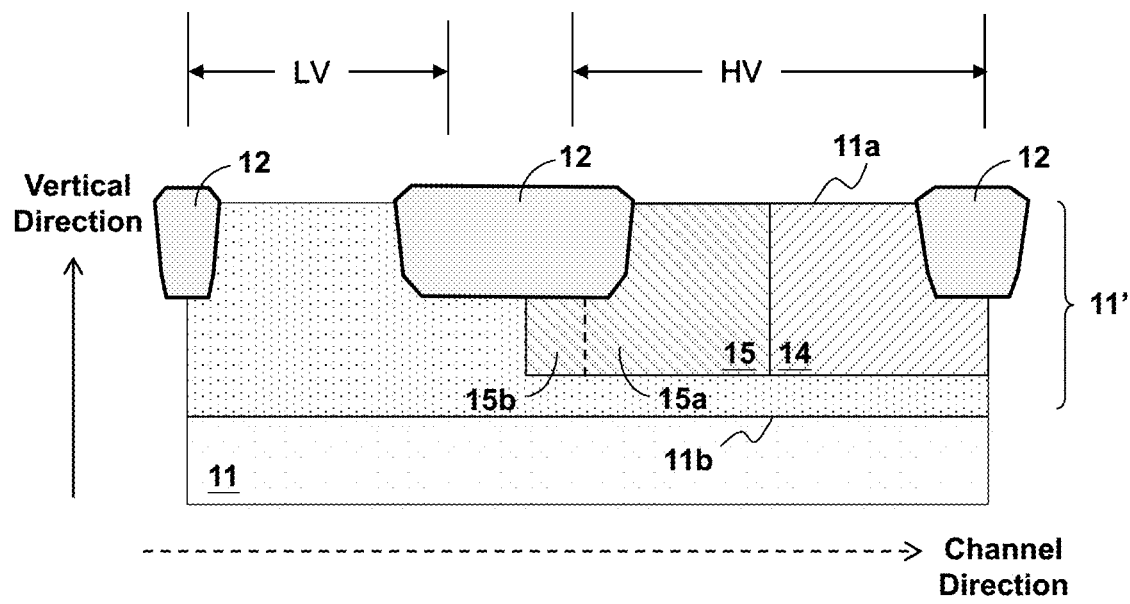

Next, referring to FIG. 1D, N-type impurities are doped into the semiconductor layer 11' at least by an ion implantation process, to form the N-type well 14. The N-type well 14 is formed in the depletion high voltage NMOS device region HV in the semiconductor layer 11'. The N-type well 14 is located below and in contact with the top surface 11a in the vertical direction. Apart of the N-type well 14 defines a drift region, which serves as a drift current channel in an ON operation of the depletion high voltage NMOS device in the depletion high voltage NMOS device region HV.

Please still refer to FIG. 1D. P-type impurities are doped in the semiconductor layer 11' at least by an ion implantation process, to form the high voltage P-type well 15. The high voltage P-type well 15 is formed in the semiconductor layer 11'. The high voltage P-type well 15 is located below and in contact with the top surface 11a in the vertical direction. The N-type well 14 and the high voltage P-type well 15 are in contact with each other in a channel direction (as indicated by the direction of the dashed arrow shown in FIG. 1D, and all occurrences of the term "channel direction" in this specification refer to the same direction).

Figure 1E:
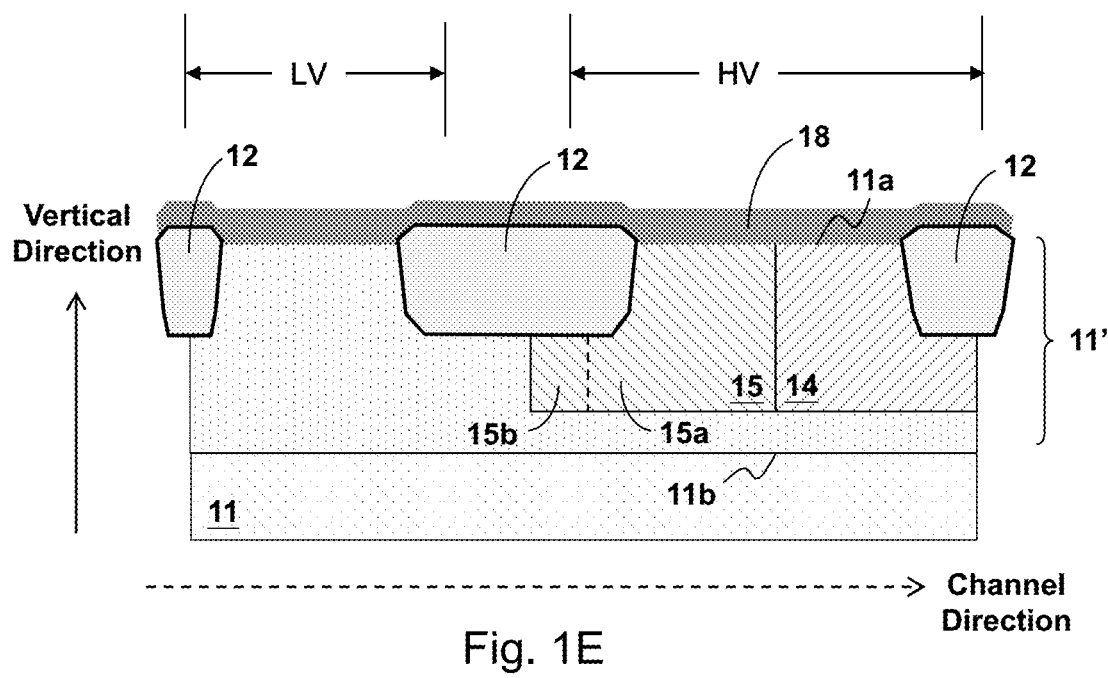

Next, referring to FIG. 1E, subsequent to the formation of the N-type well 14 and the high voltage P-type well 15, an oxide layer 18 is formed on the semiconductor layer 11'. The oxide layer 18 overlays the depletion high voltage NMOS device region HV and the depletion low voltage NMOS device region LV. The oxide layer 18 can be formed by, for example but not limited to, a chemical vapor deposition (CVD) process.

In one embodiment, the oxide layer 18 has a thickness ranging between 400 Å and 450 Å.

Figure 1F:
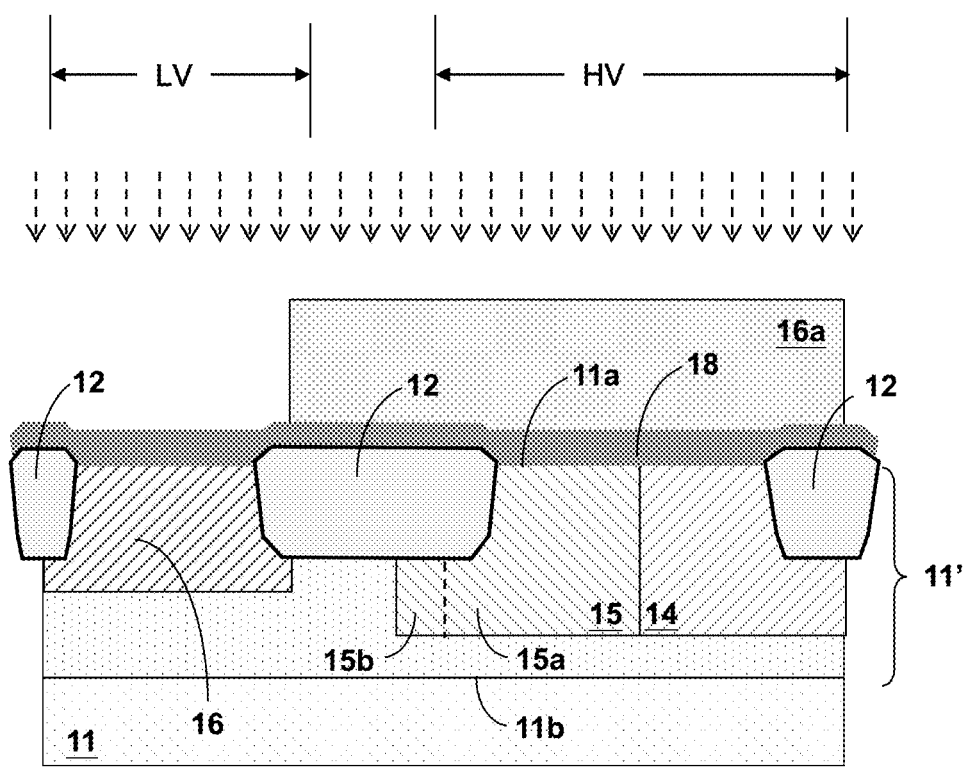

Next, referring to FIG. 1F, subsequent to the formation of the oxide layer 18, a low voltage P-type well 16 can be formed by steps including, for example but not limited to, a lithography process and an ion implantation step, wherein the lithography process includes forming a photo-resist layer 16a as a mask and the ion implantation step dopes N-type conductivity type impurities into the depletion low voltage NMOS device region LV in the semiconductor layer 11', to form the low voltage P-type well 16. In this embodiment, the low voltage P-type well 16 can be formed by, for example but not limited to, an ion implantation process, which implants N-type conductivity type impurities into a defined region for the low voltage P-type well 16 in the semiconductor layer 11' in the form of accelerated ions (as indicated by the dashed arrows shown in FIG. 1F) which pass through the oxide layer 18, to form the low voltage P-type well 16.

Figure 1G:
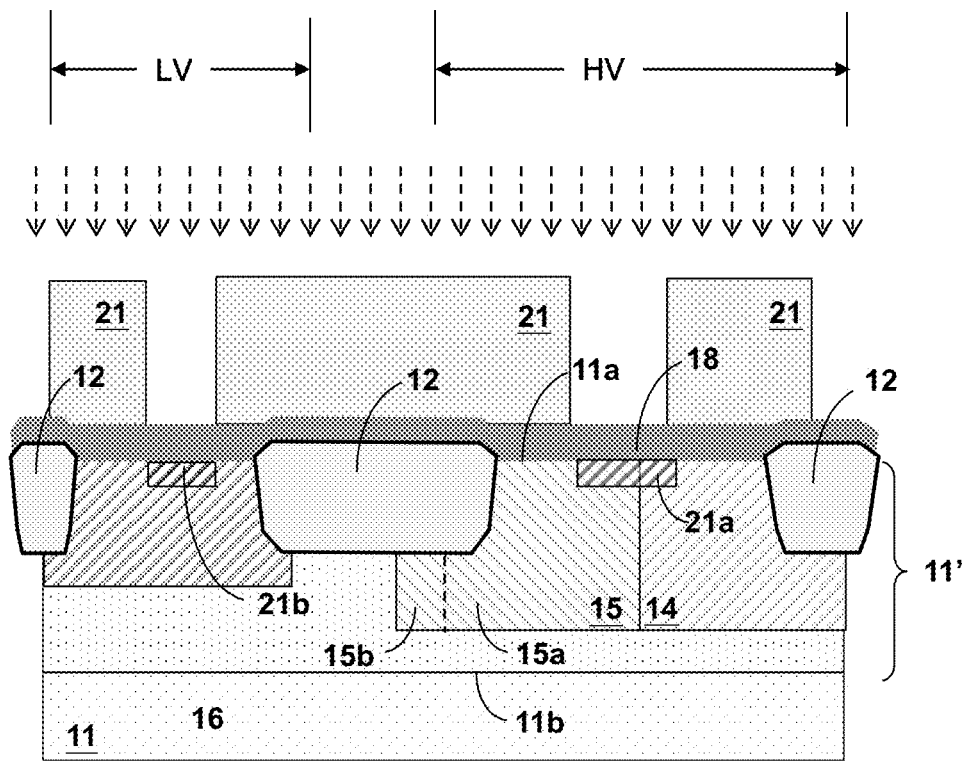

Next, referring to FIG. 1G, subsequent to the formation of the low voltage P-type well 16, an N-type high voltage channel region 21a in the depletion high voltage NMOS device region HV and an N-type low voltage channel region 21b in the depletion low voltage NMOS device region LV can be formed by steps including, for example but not limited to, a lithography process and an ion implantation step, wherein the lithography process includes forming a photo-resist layer 21 as a mask and the ion implantation step dopes N-type conductivity type impurities into the depletion high voltage NMOS device region HV and the depletion low voltage NMOS device region LV in the semiconductor layer 11', to form the N-type high voltage channel region 21a in the depletion high voltage NMOS device region HV and the N-type low voltage channel region 21b in the depletion low voltage NMOS device region LV. In this embodiment, the N-type high voltage channel region 21a and the N-type low voltage channel region 21b can be formed by, for example but not limited to, a same ion implantation process, which implants N-type conductivity type impurities into defined regions for the N-type high voltage channel region 21a and the N-type low voltage channel region 21b in the semiconductor layer 11' in the form of accelerated ions (as indicated by the dashed arrows shown in FIG. 1G) which pass through the oxide layer 18, to form the N-type high voltage channel region 21a in the depletion high voltage NMOS device region HV and the N-type low voltage channel region 21b in the depletion low voltage NMOS device region LV, such that each of the depletion high voltage NMOS device HV1 and the depletion low voltage NMOS device LV1 is turned ON when a gate-source voltage thereof is zero voltage.

Figure 1H:
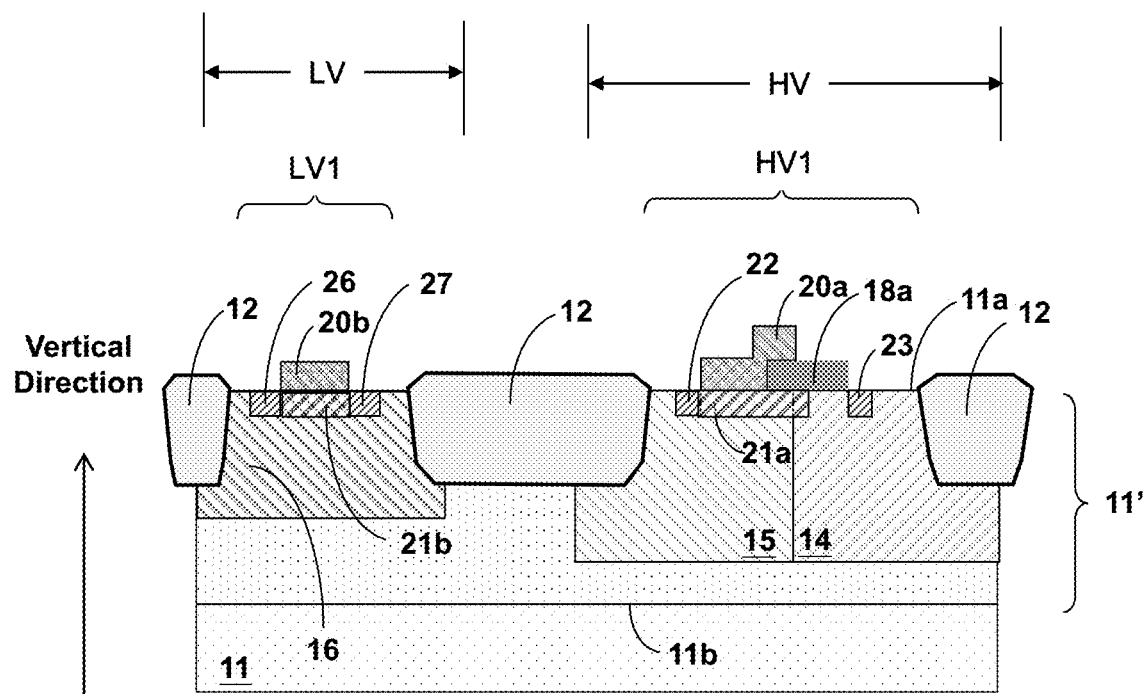

Next, referring to FIG. 1H, a reduced surface field (RESURF) oxidation region 18a, a high voltage gate 20a, a high voltage source 22 and a high voltage drain 23 are formed, so as to form the depletion high voltage NMOS device HV1 in the depletion high voltage NMOS device region HV. That is, the depletion high voltage NMOS device HV1 includes the N-type well 14, the high voltage P-type well 15, the RESURF oxidation region 18a, the high voltage gate 20a, the high voltage source 22 and the high voltage drain 23.

In one embodiment, the RESURF oxidation region 18a is formed by etching the oxide layer 18. The RESURF oxidation region 18a is formed on and in contact with the top surface 11a. The RESURF oxidation region 18a serves to reduce the surface electric field in an OFF operation of the depletion high voltage NMOS device HV1, so as to enhance the breakdown protection voltage.

Please still refer to FIG. 1H. A low voltage gate 20b, a low voltage source 26 and a low voltage drain 27 are formed in the depletion low voltage NMOS device region HV, so as to form the depletion low voltage NMOS device LV1 in the depletion low voltage NMOS device region LV. That is, the depletion low voltage NMOS device LV1 includes the low voltage P-type well 16, the low voltage gate 20b, the low voltage source 26 and the low voltage drain 27.

A part of the low voltage P-type well 16 serves as an inversion region of the depletion low voltage NMOS device region LV, so as to provide an inversion current channel of the depletion low voltage NMOS device LV1. In this embodiment, the low voltage P-type well 16 has a P-type conductivity type, whereas, each of the low voltage source 26 and the low voltage drain 27 has an N-type conductivity type.

In one embodiment, the low voltage gate 20b and the high voltage gate 20a are formed by one same process; the low voltage source 26 and the low voltage drain 27 are formed by the same process that forms the high voltage source 22 and the high voltage drain 23.

In one embodiment, the gate driving voltage of the depletion high voltage NMOS device HV1 of the depletion high voltage NMOS device region HV is 3.3V.

Note that the term "inversion current channel" means thus. Taking this embodiment as an example, when the high voltage device operates in ON operation due to the voltage applied to the gate, an inversion layer is formed below the gate, so that a conduction current flows through the region of the inversion layer, which is the inverse current channel known to a person having ordinary skill in the art, so the details thereof are not redundantly explained here. The same definition of the term "inversion current channel" is applied to other embodiments in the present invention.

Note that the term "drift current channel" means thus. Taking this embodiment as an example, the drift region provides a region where the conduction current passes through in a drifting manner when the depletion high voltage NMOS device HV1 operates in the ON operation, and the current path through the drift region is referred to as the "drift current channel", which is known to a person having ordinary skill in the art, so the details thereof are not redundantly explained here.

Note that the top surface 11*a* as referred to does not mean a completely flat plane but refers to the surface of the semiconductor layer 11'. In the present embodiment, for example, a part of the top surface 11*a* where the insulation region 12 is in contact with the semiconductor layer 11' has a recessed portion.

Note that the gate includes a conductive layer which is conductive, a dielectric layer in contact with the top surface, and a spacer layer which is electrically insulative. The conductive layer serves as an electrical contact of the gate, and is formed on and is in contact with the dielectric layer. The spacer layer is formed out of two sides of the conductive layer, as an electrical insulative layer of the gate.

In addition, the term "depletion high voltage NMOS device" refers to a transistor device wherein a voltage applied to the drain thereof in normal operation is higher than a specific voltage, such as 5V. A lateral distance (length of the drift region) between the high voltage P-type well 15 and the high voltage drain 23 of the high voltage device is determined according to the required operation voltage during normal operation, so that the device can operate at or higher than the aforementioned specific voltage, which is known to a person having ordinary skill in the art, so the details thereof are not redundantly explained here.

On the contrary, the term "depletion low voltage NMOS device" refers to a transistor device wherein a voltage applied to the drain thereof in normal operation is not higher than a specific voltage, such as 5V, which is known to a person having ordinary skill in the art, so the details thereof are not redundantly explained here.

Figure 2A:
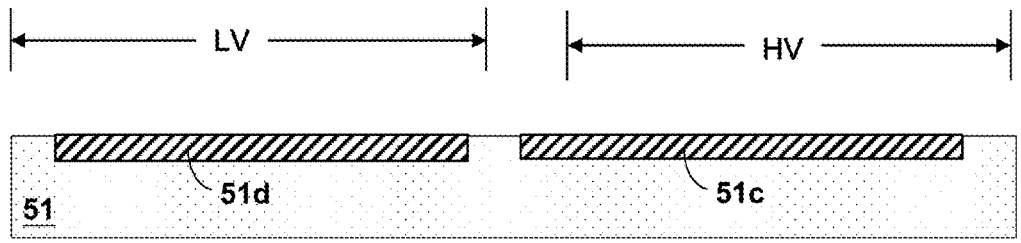
FIG. 2A to FIG. 2N show a second embodiment of the present invention.
Figure 2B:
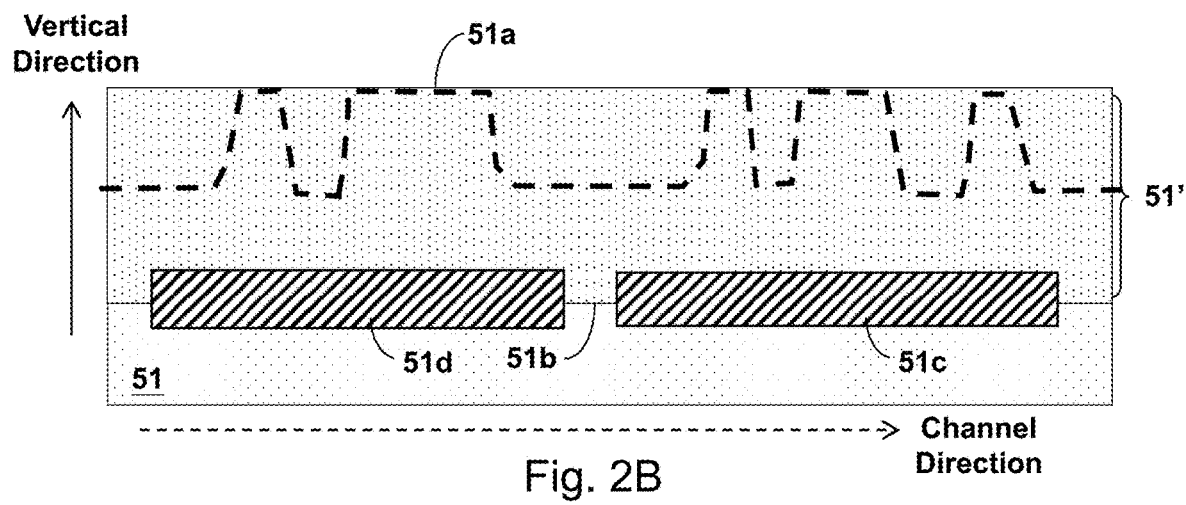
Figure 2C:
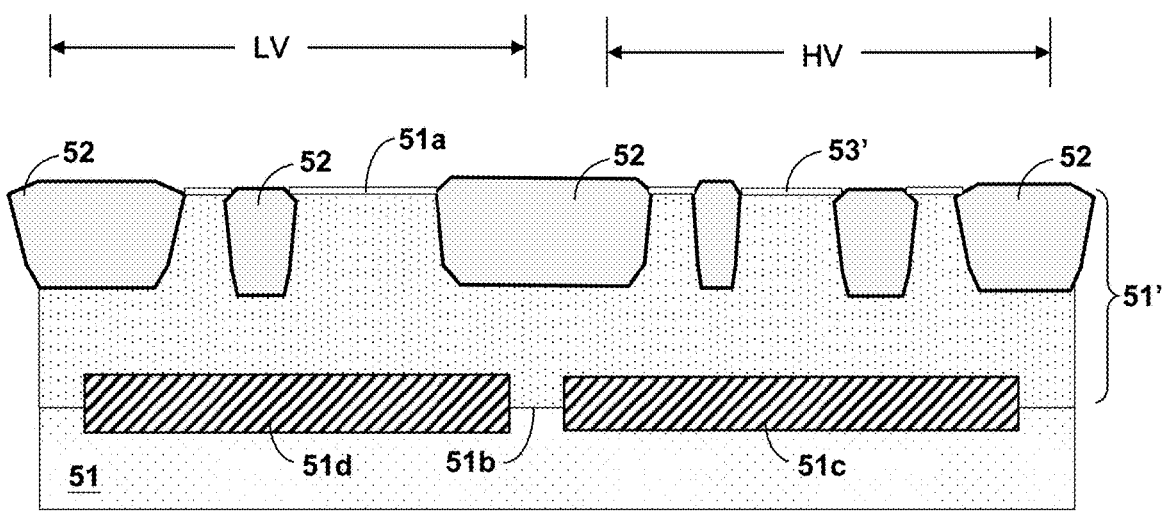
Figure 2D:
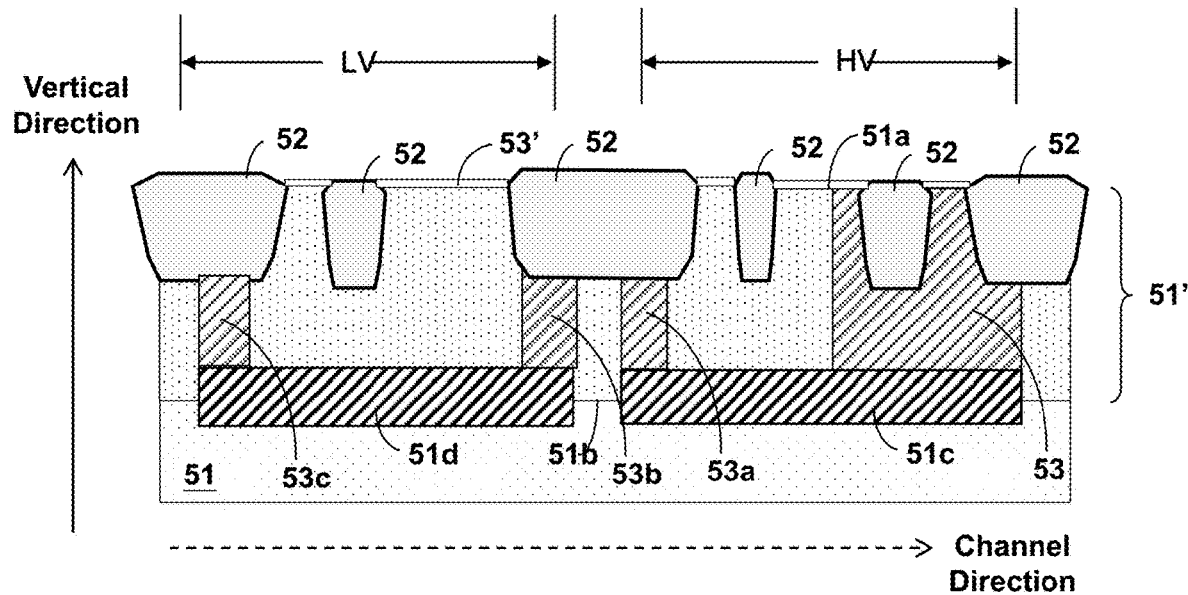
Figure 2E:
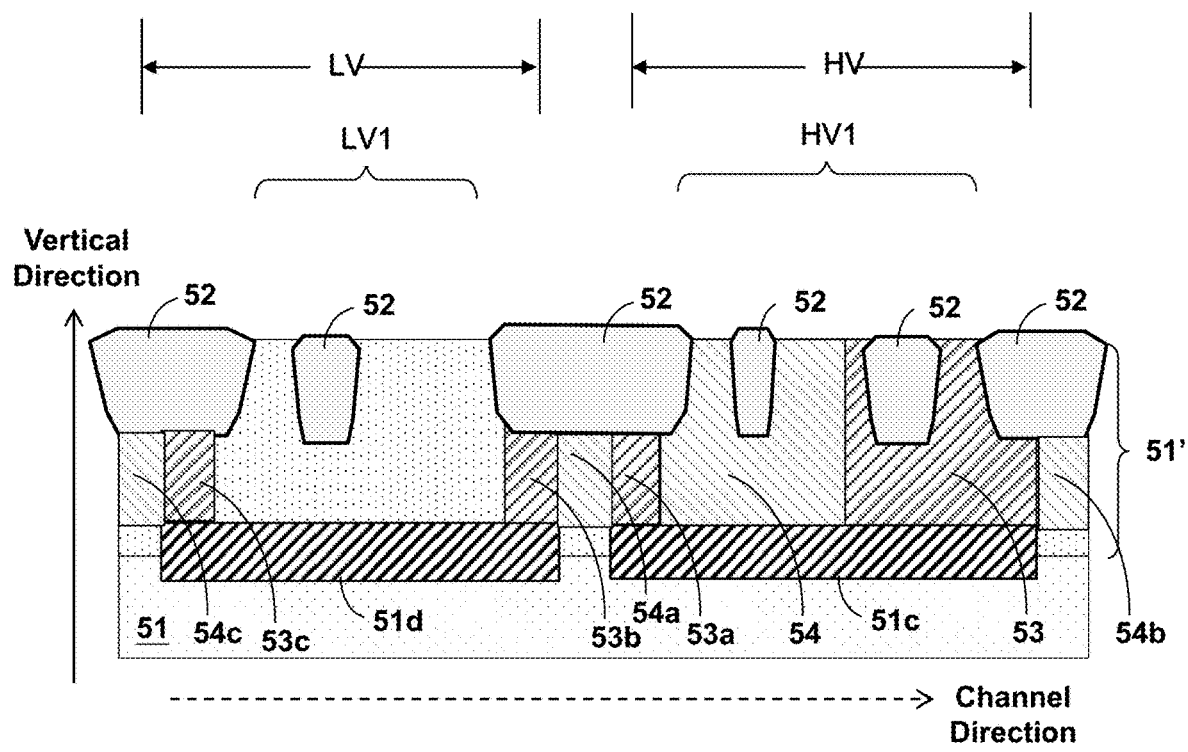
Figure 2F:
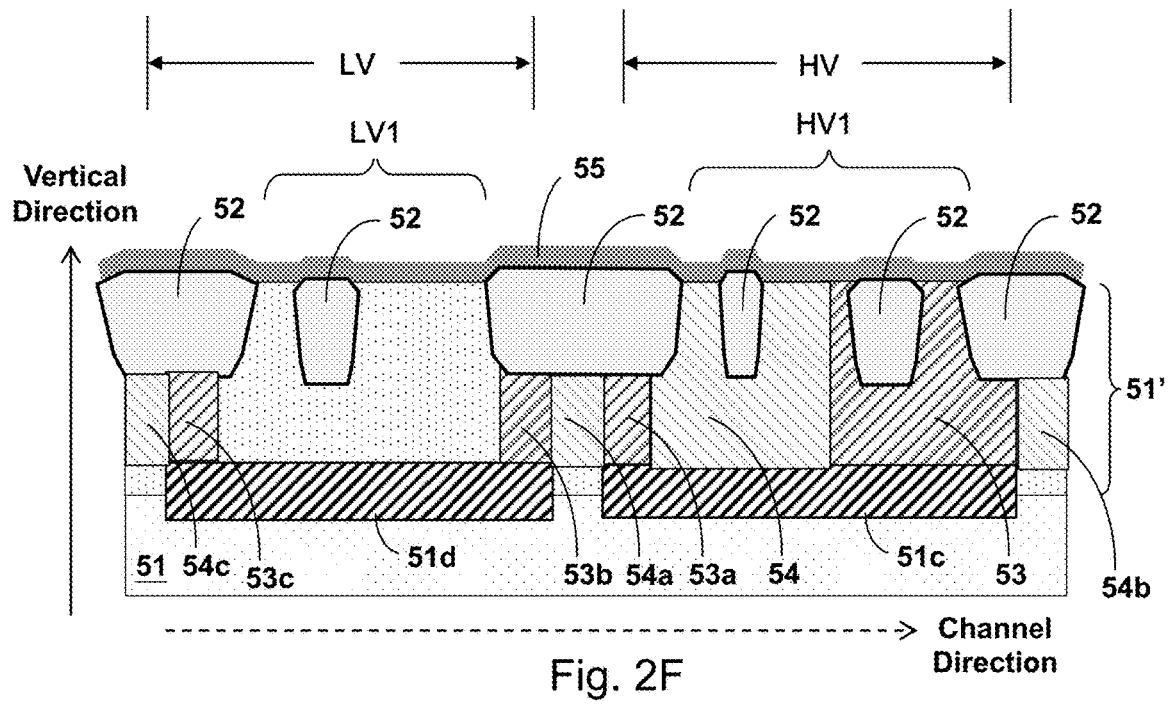
Figure 2G:
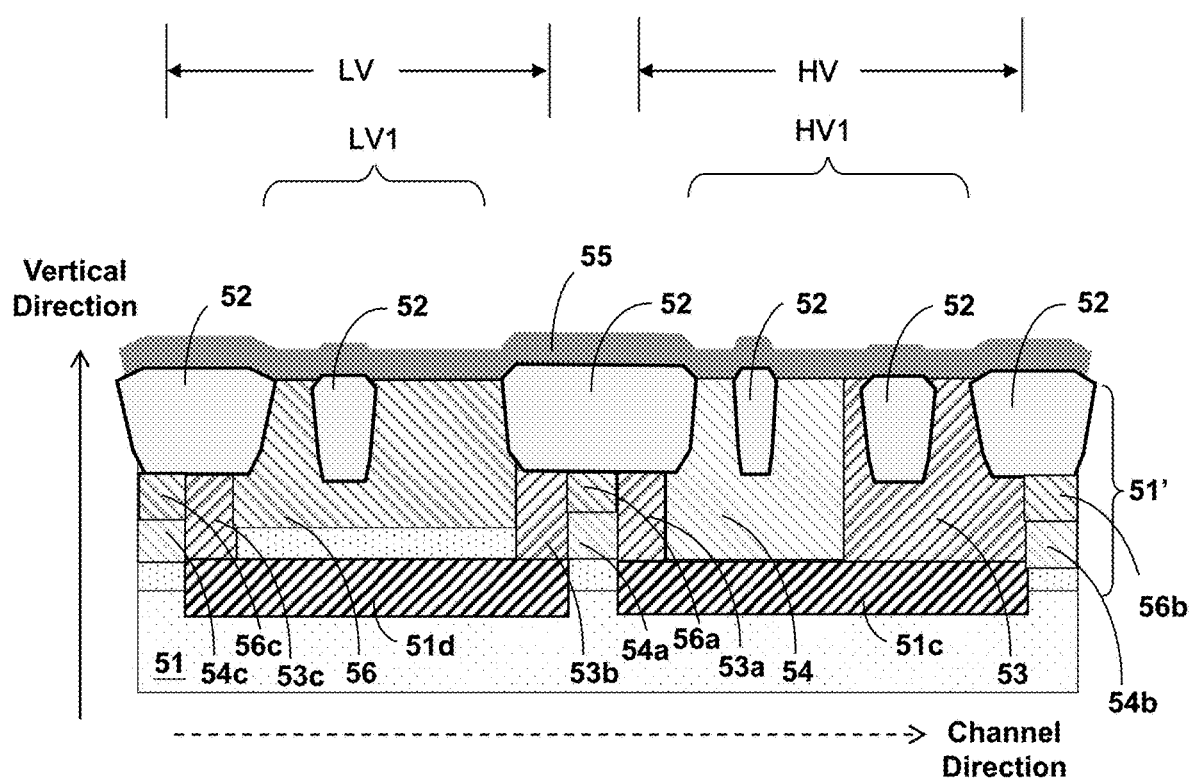
Figure 2H:
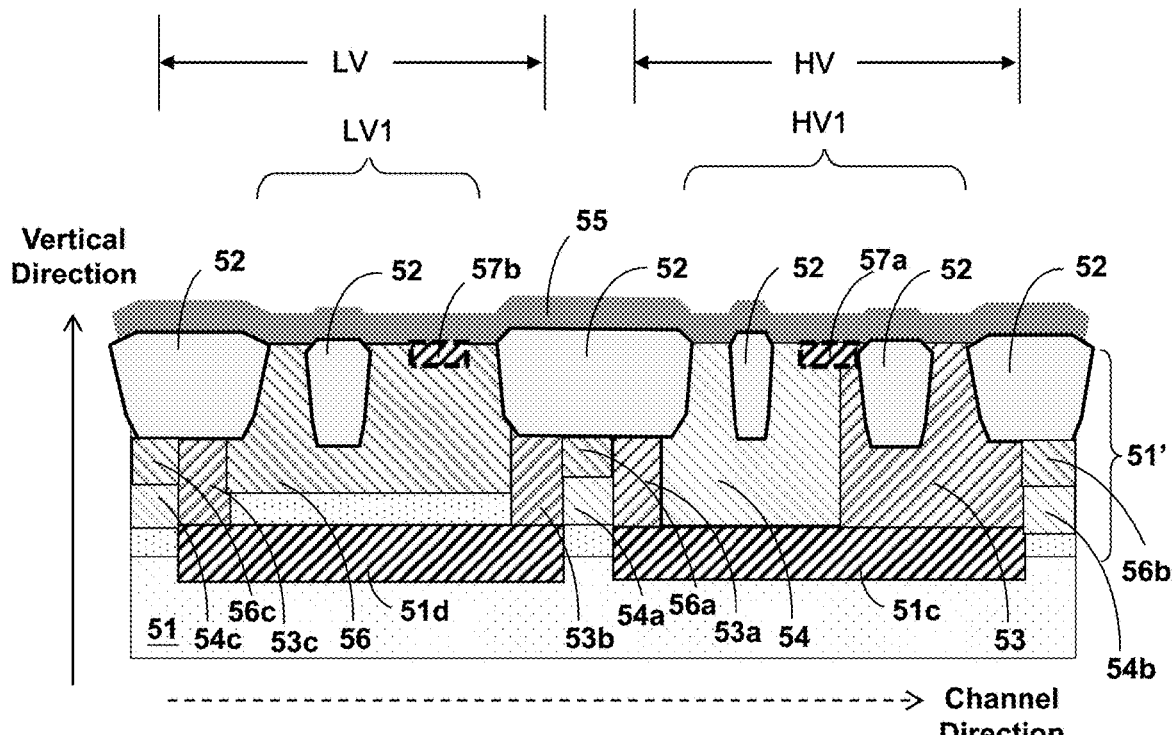
Figure 2I:
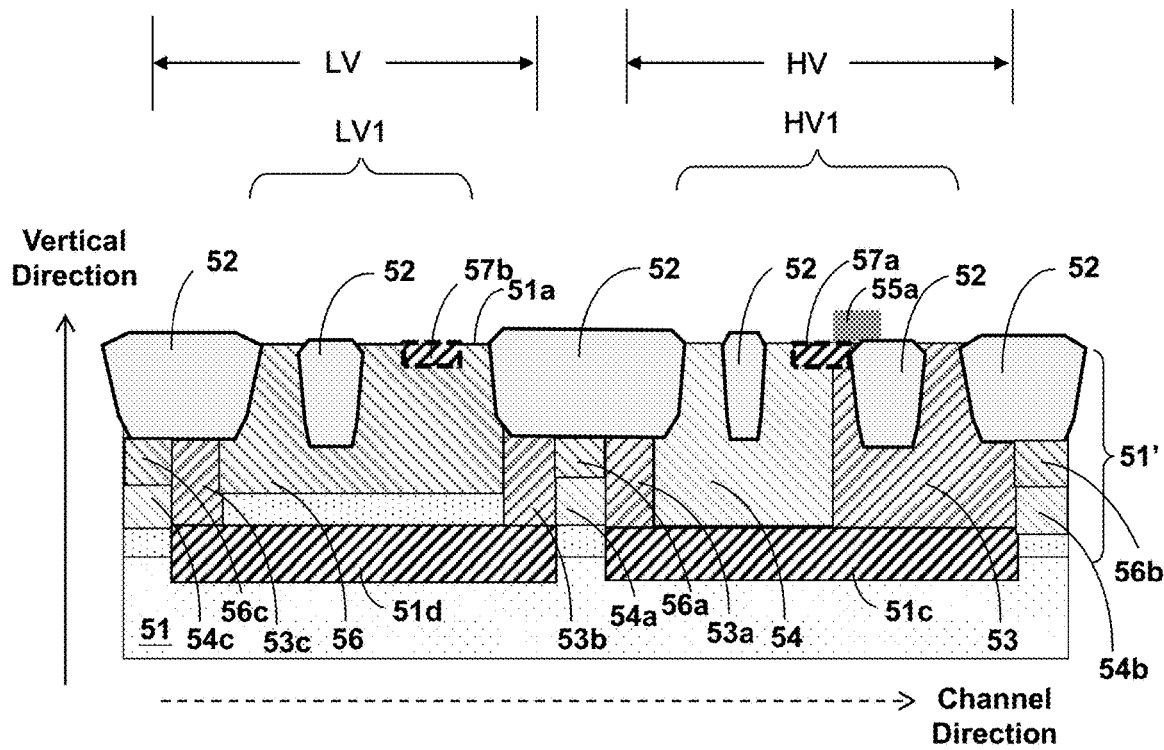
Figure 2J:
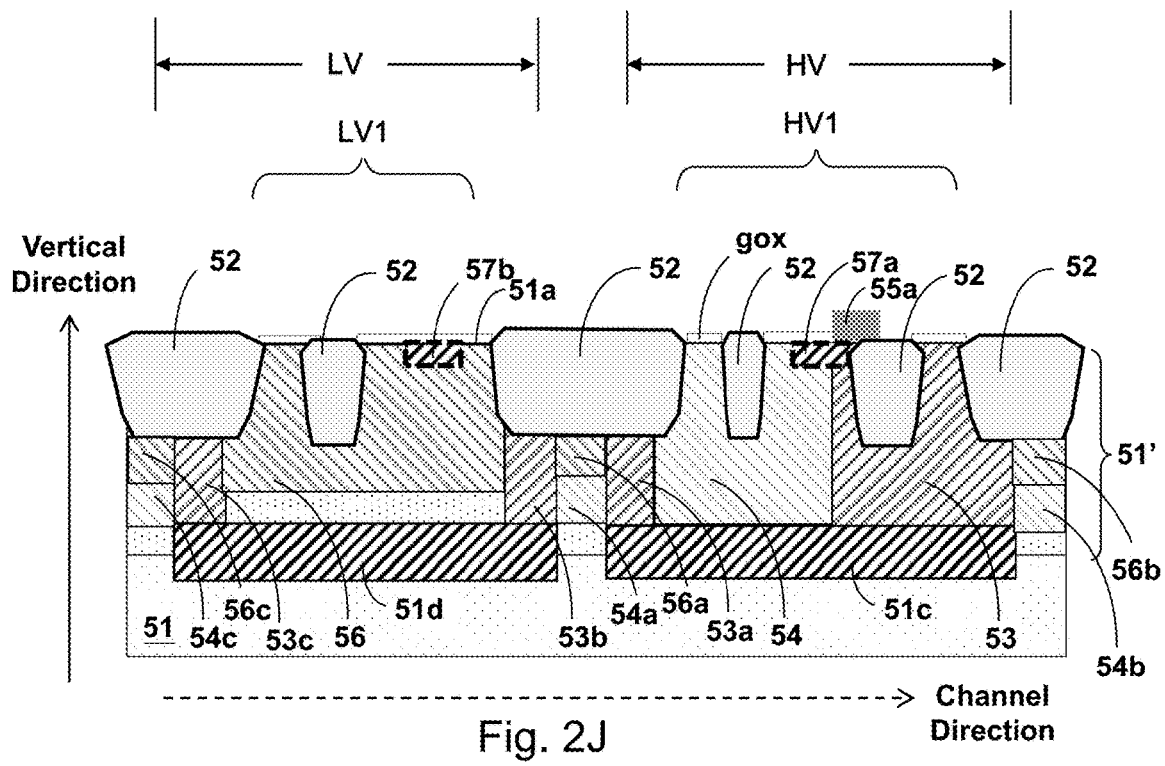
Figure 2K:
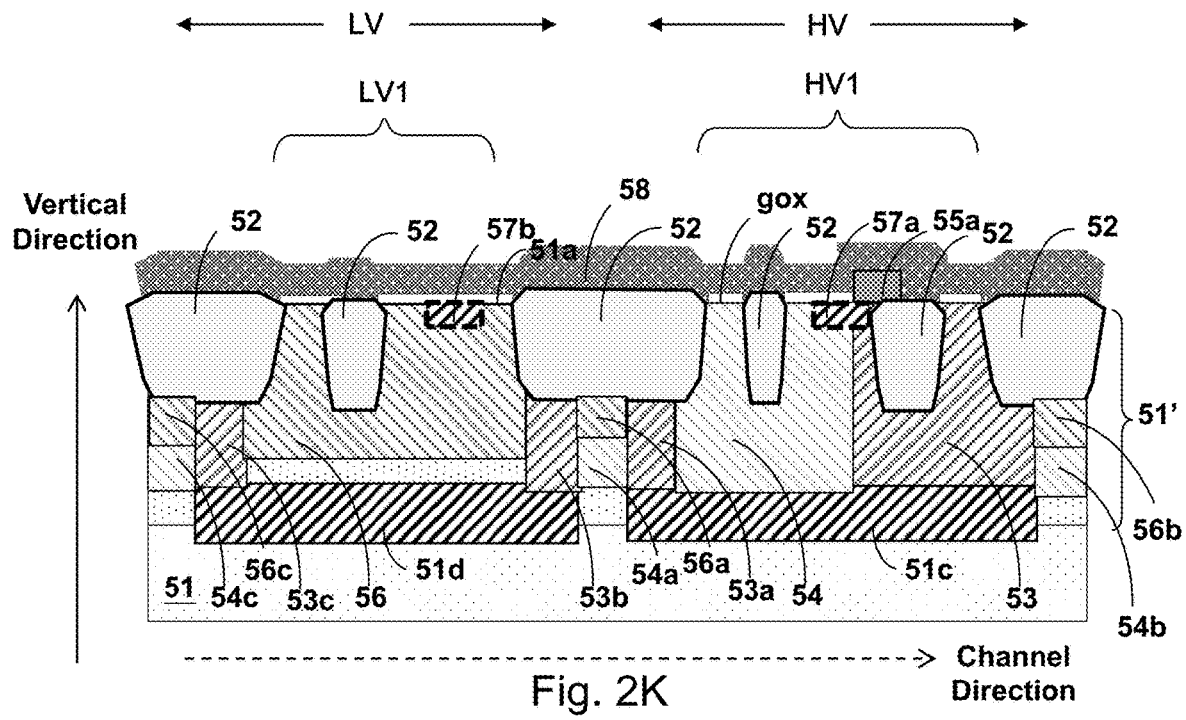
Figure 2L:
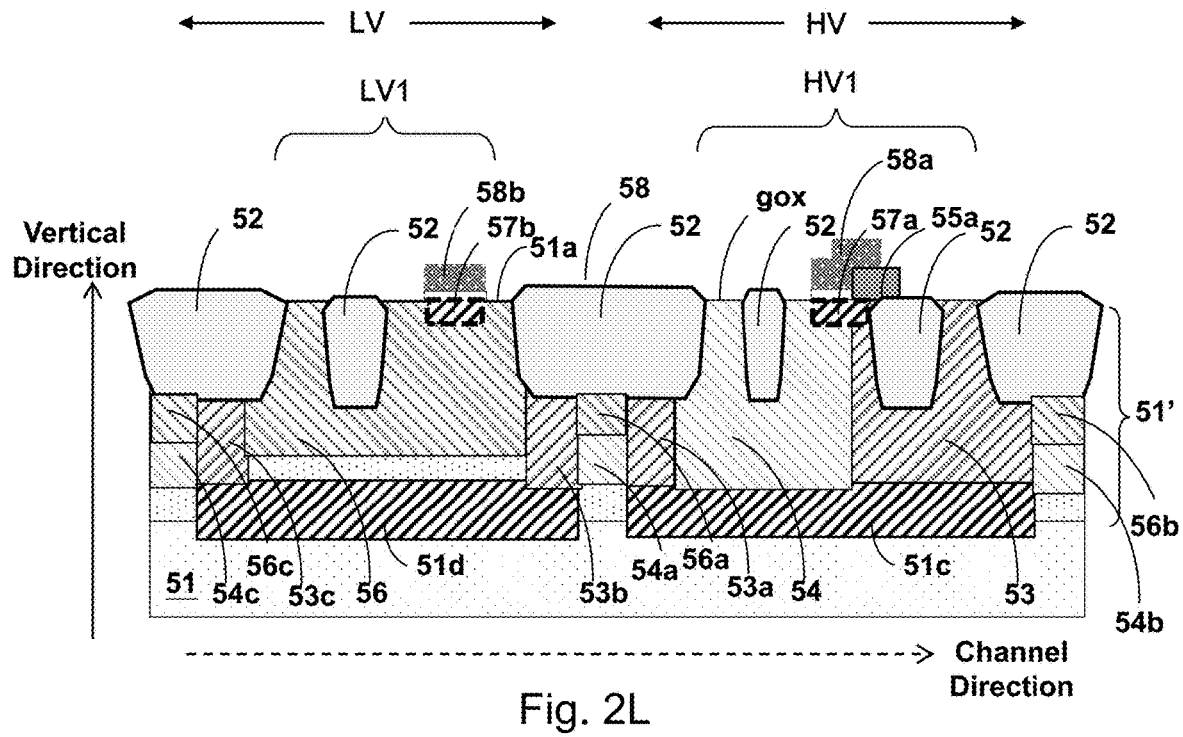
Figure 2M:
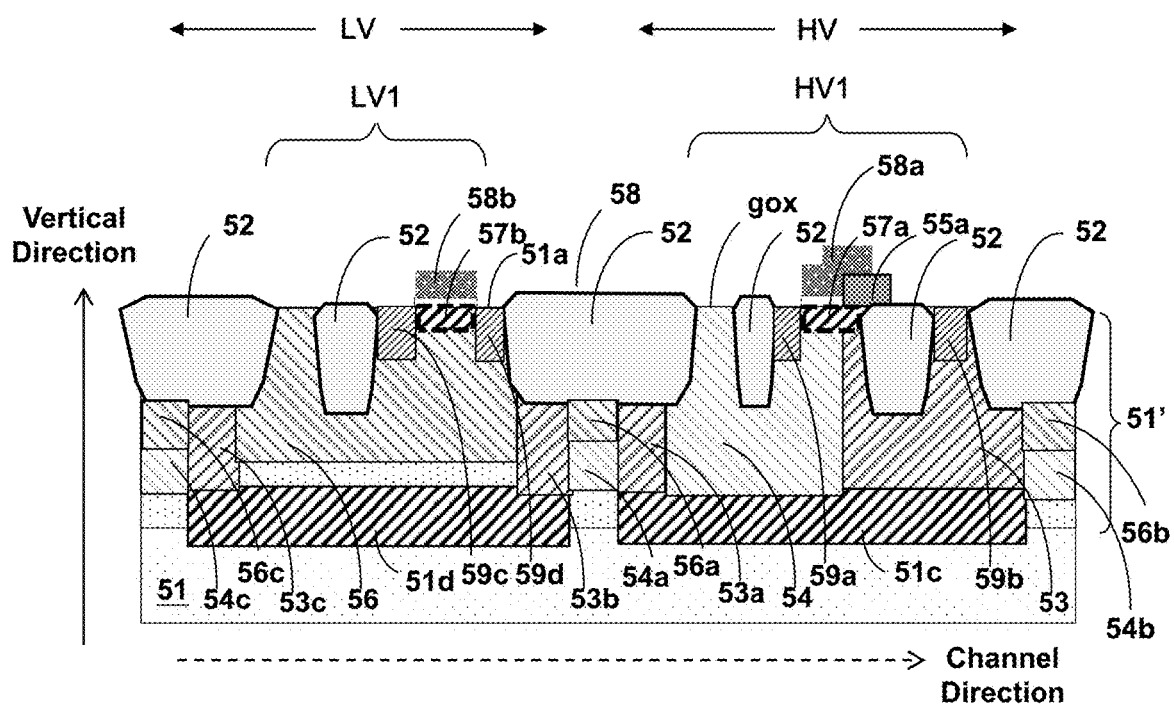
Figure 2N:
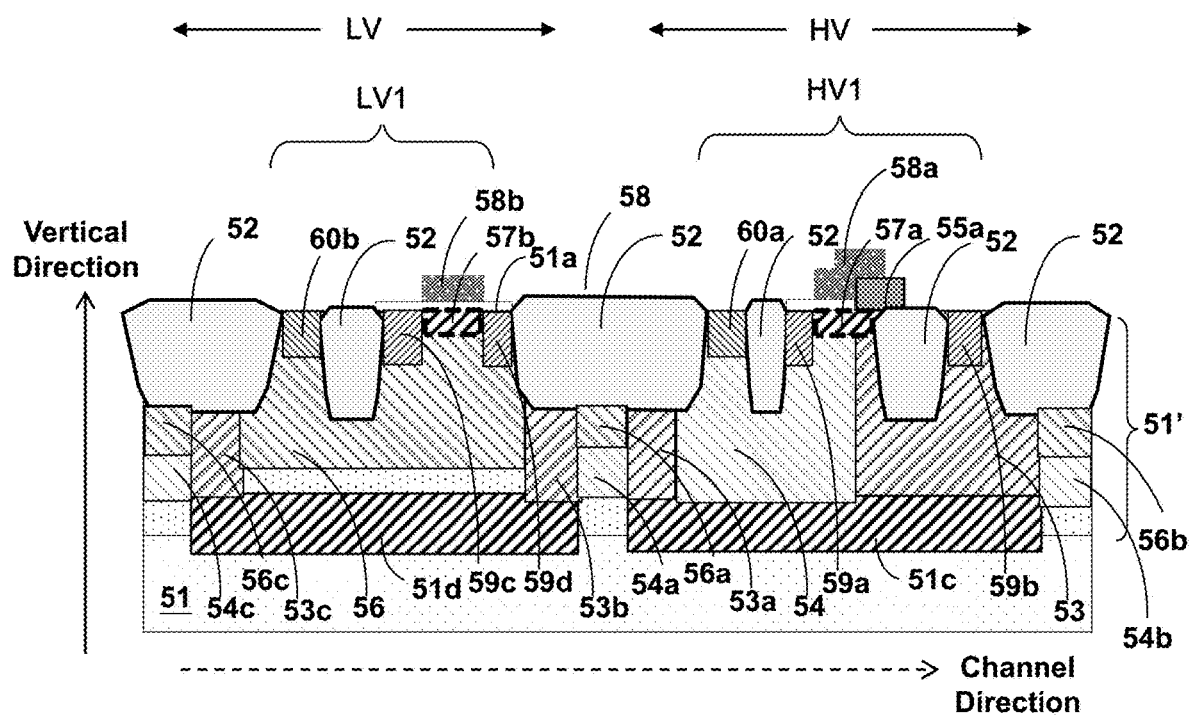

Please refer to FIG. 2A to FIG. 2N, which show a second embodiment of the present invention. FIG. 2A to FIG. 2N show cross-section views of an integration manufacturing method of a depletion high voltage NMOS device and a depletion low voltage NMOS device of the present invention.

As shown in FIG. 2A, a substrate 51 is provided. The substrate 51 is, for example but not limited to, a P-type or N-type semiconductor substrate. A depletion high voltage NMOS device and a depletion low voltage NMOS device are to be formed on the substrate 51.

Please still refer to FIG. 2A. By a same ion implantation process, a high voltage N-type buried layer 51*c* is formed in the depletion high voltage NMOS device region HV on the substrate 51 and a low voltage N-type buried layer 51*d* is formed in the depletion low voltage NMOS device region LV on the substrate 51. Each of the high voltage N-type buried layer 51*c* and the low voltage N-type buried layer 51*d* has an N-type conductivity type. The high voltage N-type buried layer 51*c* and the low voltage N-type buried layer 51*d* can be formed by, for example but not limited to, an ion implantation process, which implants N-type conductivity type impurities into the substrate 51 in the form of accelerated ions, to form the high voltage N-type buried layer 51*c* and the low voltage N-type buried layer 51*d*. For example, in a case where the semiconductor layer 51' is an epitaxial layer, prior to the formation of the epitaxial layer, the N-type conductivity type impurities can be implanted in the substrate 51 in the form of accelerated ions by an ion implantation process. Subsequently, the epitaxial layer is formed by an epitaxial layer process, so that the epitaxial layer serves as the semiconductor layer 51' (referring to FIG. 2B). Subsequently, a part of the N-type conductivity type impurities will be diffused into the semiconductor layer 51' via a thermal process, to form the high voltage N-type buried layer 51*c* and the low voltage N-type buried layer 51*d*.

Next, referring to FIG. 2B, a semiconductor layer 51' is formed on the substrate 51. The semiconductor layer 51' has a top surface 11*a* and a bottom surface 51*b* opposite to the top surface 51*a* in the vertical direction. At this moment, because the insulation regions 52 have not yet been formed on the semiconductor layer 51', the top surface 51*a* has not yet been entirely defined. Subsequent to the formation of the insulation regions 52 on the semiconductor layer 51', the top surface 51*a* will be as shown by the thick dashed line in FIG. 2B. The semiconductor layer 51', for example, is formed on the substrate 51 by an epitaxial process, or is a part of the substrate 51. The semiconductor layer 51' can be formed by various methods known to a person having ordinary skill in the art, so the details thereof are not redundantly explained here.

In one embodiment, the semiconductor layer 51' is a P-type semiconductor epitaxial layer having a volume resistance which is 45 Ohm-cm.

Next, referring to FIG. 2C, the insulation regions 52 are formed on the semiconductor layer 51', for defining a depletion high voltage NMOS device HV and a depletion low voltage NMOS device LV. The insulation regions 52 can be, for example but not limited to, a shallow trench isolation (STI) structure and a local oxidation of silicon (LOCOS) structure. Referring still to FIG. 2C, subsequent to the formation of the insulation regions 22, a sacrifice oxide layer 53' is formed on the top surface 51*a* of the semiconductor layer 51', wherein the sacrifice oxide layer 53' serves as a block layer for ion implantation during an ion implantation process for forming an N-type well 53 and a high voltage P-type well 54, thereby preventing the semiconductor layer 51' from being directly bombarded to generate defects.

Next, referring to FIG. 2D, N-type impurities are doped into the semiconductor layer 51' at least by an ion implantation process, to form the N-type well 53. The N-type well 53 is formed in the depletion high voltage NMOS device region HV in the semiconductor layer 51'. The N-type well 53 has an N-type conductivity type, and is located below and in contact with the top surface 51*a* in the vertical direction. Besides, the N-type well is in contact with 53 with the high voltage N-type buried layer 51*c* in the vertical direction. A part of the N-type well 53 defines a drift region, which serves as a drift current channel in an ON operation of the depletion high voltage NMOS device in the depletion high voltage NMOS device region HV.

Please still refer to FIG. 2D. A first N-type isolation region 53*a* is formed in the semiconductor layer 51' by the same ion implantation process that forms the N-type well 53. The first N-type isolation region 53*a* is connected to the high voltage N-type buried layer 51*c* in the vertical direction. In the channel direction, the first N-type isolation region 53*a* is in contact with a side of the high voltage P-type well 54 (referring to FIG. 2E), wherein this side of the high voltage P-type well 54 is opposite to another side of the high voltage P-type well 54 which is in contact with the N-type well 53.

Please still refer to FIG. 2D. A second N-type isolation region 53b and a third N-type isolation region 53c are formed in the semiconductor layer 51' by the same ion implantation process that forms the N-type well 53. The second N-type isolation region 53b and the third N-type isolation region 53C are both connected to the low voltage N-type buried layer 51d in the vertical direction. In the channel direction, the second N-type isolation region 53b is in contact with one side of the low voltage P-type well 56, whereas, the third N-type isolation region 53c is in contact with another side of the low voltage P-type well 56 (referring to FIG. 2G).

Next, referring to FIG. 2E, P-type impurities are doped in the semiconductor layer 51' at least by an ion implantation process, to form the high voltage P-type well 54. The high voltage P-type well 54 is formed in the semiconductor layer 51' in the depletion high voltage NMOS device region HV. The high voltage P-type well 15 has a P-type conductivity type, and is in contact with the top surface 51a and the high voltage N-type buried layer 51c in the vertical direction. In the depletion high voltage NMOS device region HV, the N-type well 53 and the high voltage P-type well 54 are in contact with each other in the channel direction.

Please still refer to FIG. 2E. A first P-type isolation region 54 is formed between the depletion high voltage NMOS device region HV and the depletion low voltage NMOS device region LV by the same ion implantation process that forms the high voltage P-type well 54. In one embodiment, a first P-type isolation region 54b and a first P-type isolation region 54c are formed by the same ion implantation process that forms the high voltage P-type well 54, and In one embodiment, the depletion high voltage NMOS device region HV and the depletion low voltage NMOS device region LV can be arranged in a mirror layout. In this embodiment, the first P-type isolation region 54b and the first P-type isolation region 54c are both located between the depletion high voltage NMOS device region HV and the depletion low voltage NMOS device region LV.

Next, referring to FIG. 2F, subsequent to the formation of the N-type well 53 and the high voltage P-type well 54, an oxide layer 55 is formed on the semiconductor layer 51'. The oxide layer 55 overlays the depletion high voltage NMOS device region HV and the depletion low voltage NMOS device region LV. The oxide layer 55 can be formed by, for example but not limited to, a chemical vapor deposition (CVD) process.

In one embodiment, the oxide layer 55 has a thickness ranging between 400 Å and 450 Å

Next, referring to FIG. 2G, subsequent to the formation of the oxide layer 55, a low voltage P-type well 56 can be formed by steps including, for example but not limited to, a lithography process and an ion implantation step, wherein the lithography process includes forming a photo-resist layer (not shown) as a mask and the ion implantation step dopes P-type conductivity type impurities into the depletion low voltage NMOS device region LV in the semiconductor layer 51', to form the low voltage P-type well 56. In this embodiment, the low voltage P-type well 56 can be formed by, for example but not limited to, an ion implantation process, which implants P-type conductivity type impurities into a defined region for the low voltage P-type well 56 in the semiconductor layer 51' in the form of accelerated ions (as indicated by the dashed arrows shown in FIG. 2G) which pass through the oxide layer 55, to form the low voltage P-type well 56.

Please still refer to FIG. 2G. A second P-type isolation region 56a is formed between the depletion high voltage NMOS device region HV and the depletion low voltage NMOS device region LV by the same ion implantation process that forms the low voltage P-type well 56. In one embodiment, a second P-type isolation region 56b and a second P-type isolation region 56c are formed by the same ion implantation process that forms the low voltage P-type well 56. In one embodiment, the depletion high voltage NMOS device region HV and the depletion low voltage NMOS device region LV can be arranged in a mirror layout. In this embodiment, the second P-type isolation region 56b and the second P-type isolation region 56c are both located between the depletion high voltage NMOS device region HV and the depletion low voltage NMOS device region LV.

Next, referring to FIG. 2H, subsequent to the formation of the oxide layer 55, an N-type high voltage channel region 57a in the depletion high voltage NMOS device region HV and an N-type low voltage channel region 57b in the depletion low voltage NMOS device region LV can be formed by steps including, for example but not limited to, a lithography process and an ion implantation step, wherein the lithography process includes forming a photo-resist layer (not shown) as a mask and the same ion implantation step dopes N-type conductivity type impurities into the depletion high voltage NMOS device region HV and the depletion low voltage NMOS device region LV in the semiconductor layer 51', to form the N-type high voltage channel region 57a in the depletion high voltage NMOS device region HV and the N-type low voltage channel region 57b in the depletion low voltage NMOS device region LV. To be more specific, the N-type high voltage channel region 57a is located vertically below a high voltage gate 58a in the depletion high voltage NMOS device region HV and is in contact with the top surface 51a, whereas, the N-type low voltage channel region 57b is located vertically below a high voltage gate 58b in the depletion low voltage NMOS device region LV and is in contact with the top surface 51a, such that each of the depletion high voltage NMOS device HV1 and the depletion low voltage NMOS device LV1 is turned ON when a gate-source voltage thereof is zero voltage. In this embodiment, the N-type high voltage channel region 57a and the N-type low voltage channel region 57b can be formed by, for example but not limited to, an ion implantation process, which implants N-type conductivity type impurities into the semiconductor layer 51' in the form of accelerated ions which pass through the oxide layer 55, to form the N-type high voltage channel region 57a and the N-type low voltage channel region 57b.

In this embodiment, the first P-type isolation region 54a is connected to the second P-type isolation region 56a in the vertical direction. In this embodiment, the high voltage N-type buried layer 51C, the first N-type isolation region 53a, the first P-type isolation region 54a and the second P-type isolation region 56a constitute a high voltage isolation region, which serves to electrically isolate the depletion high voltage NMOS device region HV from the depletion low voltage NMOS device region LV in the semiconductor layer 51'.

Next, referring to FIG. 2I, subsequent to the formation of the low voltage P-type well 56, the N-type high voltage channel region 57a and the N-type low voltage channel region 57b, the oxide layer 55 is patterned by a lithography process and an etching process, so as to form a reduced surface field (RESURF) oxidation region 55a in the depletion high voltage NMOS device region HV. In one embodiment, the RESURF oxidation region 55a is formed by etching the oxide layer 55. The RESURF oxidation region 55a is formed on and in contact with the top surface 51a.

The RESURF oxidation region 18a serves to reduce the surface electric field in an OFF operation of the depletion high voltage NMOS device HV1, so as to enhance a breakdown protection voltage.

Next, referring to FIG. 2J, subsequent to the formation of the RESURF oxidation region 55a, a gate oxide layer gox is formed on the semiconductor layer 51', wherein the gate oxide layer gox is in contact with the semiconductor layer 51'. The gate oxide layer gox overlays the depletion high voltage NMOS device region HV and the depletion low voltage NMOS device region LV. In one embodiment, the gate oxide layer gox has a thickness ranging between 80 Å and 100 Å.

Please refer to FIG. 2K. A polysilicon layer 58 is formed on the gate oxide layer gox, wherein the polysilicon layer 58 is in contact with the gate oxide layer gox. The polysilicon layer 58 can be formed by for example but not limit to a deposition process.

Next, referring to FIG. 2L, the polysilicon layer 58 is patterned by a lithography process and an etching process, so as to form a high voltage gate 58a in the depletion high voltage NMOS device region HV and a low voltage gate 58b in the depletion low voltage NMOS device region LV.

Next, referring to FIG. 2M, a high voltage source 59a and a high voltage drain 59b in the semiconductor layer 51' are formed for example by one same ion implantation process, wherein the high voltage source 59a and the high voltage drain 59b are located below and outside two sides of the high voltage gate 58a, respectively, wherein the side of the high voltage gate 58a which is closer to the high voltage source 59a is a source side and the side of the high voltage gate 58a which is closer to the high voltage drain 59b is a drain side, and wherein the high voltage source 59a is located in the high voltage P-type well 54, and the high voltage drain 59b is located in the N-type well 53 outside the drain side. In the channel direction, the drift region is located in the N-type well 54 and is located between the high voltage drain 59b and the high voltage P-type well 53, wherein each of the high voltage source 59b and the high voltage drain 59c has a N-type conductivity type.

Please still refer to FIG. 2M. A low voltage source 59c and a low voltage drain 59d are formed in the depletion low voltage NMOS device region LV in the semiconductor layer 51' by the same ion implantation process that forms the high voltage source 59a and the high voltage drain 59b, wherein the low voltage source 59a and the low voltage drain 59b are located below and outside two sides of the low voltage gate 58b, respectively, wherein the side of the low voltage gate 58b which is closer to the low voltage source 58c is a source side and the side of the low voltage gate 58b which is closer to the low voltage drain 59d is a drain side, and wherein the low voltage source 59c is located in the low voltage P-type well 56, and the low voltage drain 59d is located in the low voltage P-type well 56 outside the drain side.

Next, referring to FIG. 2N, a high voltage P-type contact region 60a in the high voltage P-type well 54 and a low voltage P-type contact region 60b in the low voltage P-type well 56 are formed by a same ion implantation process, wherein the high voltage P-type contact region 60a serves as an electrical contact of the high voltage P-type well 54, whereas, the low voltage P-type contact region 60b serves as an electrical contact of the low voltage P-type well 56.

In one embodiment, the gate driving voltage of thea depletion high voltage NMOS device HV1 of the depletion high voltage NMOS device region HV is 3.3V.

In one embodiment, the low voltage gate 58b has a minimum length which is larger than or equal to 0.18 micrometer. In one embodiment, the depletion low voltage NMOS device LV1 has a minimum feature size which is 0.18 micrometer.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, other process steps or structures, such as a lightly doped drain (LDD) may be added. For another example, the lithography process is not limited to the mask technology but it can also include electron beam lithography. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An integration manufacturing method of a depletion high voltage NMOS device and a depletion low voltage NMOS device, comprising:
   providing a substrate;
   forming a semiconductor layer on the substrate;
   forming a plurality of insulation regions on the semiconductor layer, for defining a depletion high voltage NMOS device region and a depletion low voltage NMOS device region;
   forming an N-type well in the semiconductor layer in the depletion high voltage NMOS device region, wherein a part of the N-type well defines a drift region to serve as a drift current channel in an ON operation of the depletion high voltage NMOS device;
   forming a high voltage P-type well in the semiconductor layer in the depletion high voltage NMOS device region, wherein the N-type well and the high voltage P-type well are in contact with each other in a channel direction;
   subsequent to the formation of the N-type well and the high voltage P-type well, forming an oxide layer on the semiconductor layer, wherein the oxide layer overlays the depletion high voltage NMOS device region and the depletion low voltage NMOS device region;
   subsequent to the formation of the oxide layer, forming a low voltage P-type well in the semiconductor layer in the depletion low voltage NMOS device region; wherein the low voltage P-type well is formed by implanting impurities which pass through the oxide layer in a defined region in the form of accelerated ions via an ion implantation process step; and
   forming an N-type high voltage channel region in the depletion high voltage NMOS device region and forming an N-type low voltage channel region in the depletion low voltage NMOS device region via a same ion implantation process, such that each of the depletion high voltage NMOS device and the depletion low voltage NMOS device is turned ON when a gate-source voltage thereof is zero voltage.

2. The integration manufacturing method of a depletion high voltage NMOS device and a depletion low voltage NMOS device of claim 1, further comprising:
  forming a high voltage N-type buried layer on the substrate and in the depletion high voltage NMOS device region via an ion implantation process step;
  forming a first N-type isolation region in the semiconductor layer by a same ion implantation process that forms the N-type well, wherein the first N-type isolation region is connected to the high voltage N-type buried layer in a vertical direction, and wherein in the channel direction, the first N-type isolation region is in contact with a side of the high voltage P-type well, wherein this side of the high voltage P-type well is opposite to another side of the high voltage P-type well which is in contact with the N-type well;
  forming a first P-type isolation region between the depletion high voltage NMOS device region and the depletion low voltage NMOS device region by a same ion implantation process that forms the high voltage P-type well; and
  forming a second P-type isolation region between the depletion high voltage NMOS device region and the depletion low voltage NMOS device region by the same ion implantation process that forms the low voltage P-type well;
  wherein the first P-type isolation region is connected to the second P-type isolation region in the vertical direction;
  wherein the high voltage N-type buried layer, the first N-type isolation region, the first P-type isolation region and the second P-type isolation region constitute a high voltage isolation region, which serves to electrically isolate the depletion high voltage NMOS device region from the depletion low voltage NMOS device region in the semiconductor layer.

3. The integration manufacturing method of a depletion high voltage NMOS device and a depletion low voltage NMOS device of claim 2, further comprising:
  subsequent to the formation of the low voltage P-type well, etching the oxide layer by a lithography process and an etching process, to form a reduced surface field (RESURF) oxidation region in the depletion high voltage NMOS device region;
  subsequent to the formation of the RESURF oxidation region, forming a gate oxide layer on the semiconductor layer, wherein the gate oxide layer is in contact with the semiconductor layer, wherein the gate oxide layer overlays the depletion high voltage NMOS device region and the depletion low voltage NMOS device region;
  forming a polysilicon layer on the gate oxide layer, wherein the polysilicon layer is in contact with the gate oxide layer; and
  etching the polysilicon layer by a lithography process and an etching process, to form a high voltage gate in the depletion high voltage NMOS device region and a low voltage gate in the depletion low voltage NMOS device region.

4. The integration manufacturing method of a depletion high voltage NMOS device and a depletion low voltage NMOS device of claim 3, further comprising:
  forming a low voltage N-type buried layer on the substrate and in the depletion low voltage NMOS device region by the same ion implantation process that forms the high voltage N-type buried layer; and
  forming a second N-type isolation region and a third N-type isolation region in the semiconductor layer by the same ion implantation process that forms the N-type well, wherein the second N-type isolation region and the third N-type isolation region are both connected to the low voltage N-type buried layer in the vertical direction, wherein in the channel direction, the second N-type isolation region is in contact with one side of the low voltage P-type well, whereas, the third N-type isolation region is in contact with another side of the low voltage P-type well;
  wherein the low voltage N-type buried layer, the second N-type isolation region and the third N-type isolation region constitute a low voltage isolation region, which serves to electrically isolate the depletion low voltage NMOS device region from the depletion high voltage NMOS device region in the semiconductor layer.

5. The integration manufacturing method of a depletion high voltage NMOS device and a depletion low voltage NMOS device of claim 4, further comprising:
  forming a high voltage source and a high voltage drain in the semiconductor layer, wherein the high voltage source and the high voltage drain are located below and outside two sides of the high voltage gate, respectively, wherein the side of the high voltage gate which is closer to the high voltage source is a source side and the side of the high voltage gate which is closer to the high voltage drain is a drain side, and wherein the high voltage source is located in the high voltage P-type well, and the high voltage drain is located in the N-type well outside the drain side;
  and wherein in the channel direction, the drift region is located in the N-type well and is located between the high voltage drain and the high voltage P-type well, wherein each of the high voltage source and the high voltage drain has a N-type conductivity type.

6. The integration manufacturing method of a depletion high voltage NMOS device and a depletion low voltage NMOS device of claim 5, further comprising:
  forming a low voltage source and a low voltage drain in depletion low voltage NMOS device region in the semiconductor layer by the same ion implantation process that forms the high voltage source and the high voltage drain, wherein the low voltage source and the low voltage drain are located below and outside two sides of the low voltage gate, respectively, wherein the side of the low voltage gate which is closer to the low voltage source is a source side and the side of the low voltage gate which is closer to the low voltage drain is a drain side, and wherein the low voltage source is located in the low voltage P-type well, and the low voltage drain is located in the low voltage P-type well outside the drain side.

7. The integration manufacturing method of a depletion high voltage NMOS device and a depletion low voltage NMOS device of claim 6, further comprising:
  forming a high voltage P-type contact region in the high voltage P-type well and forming a low voltage P-type contact region in the low voltage P-type well by a same ion implantation process, wherein the high voltage P-type contact region serves as an electrical contact of the high voltage P-type well, whereas, the low voltage P-type contact region serves as an electrical contact of the low voltage P-type well.

8. The integration manufacturing method of a depletion high voltage NMOS device and a depletion low voltage NMOS device of claim 1, wherein the semiconductor layer is a P-type semiconductor epitaxial layer having a volume resistance which is 45 Ohm-cm.

9. The integration manufacturing method of a depletion high voltage NMOS device and a depletion low voltage NMOS device of claim 3, wherein the RESURF oxidation region has a thickness ranging between 400 Å and 450 Å.

10. The integration manufacturing method of a depletion high voltage NMOS device and a depletion low voltage NMOS device of claim 3, wherein the gate oxide layer has a thickness ranging between 80 Å and 100 Å.

11. The integration manufacturing method of a depletion high voltage NMOS device and a depletion low voltage NMOS device of claim 1, wherein a gate driving voltage of the depletion high voltage NMOS device of the depletion high voltage NMOS device region is 3.3V.

12. The integration manufacturing method of a depletion high voltage NMOS device and a depletion low voltage NMOS device of claim 6, wherein the low voltage gate has a minimum length which is 0.18 micrometer, and wherein the depletion low voltage NMOS device has a minimum feature size which is 0.18 micrometer.

\* \* \* \* \*